US006932874B2

(12) United States Patent
Marancik et al.

(10) Patent No.: US 6,932,874 B2
(45) Date of Patent: Aug. 23, 2005

(54) METHOD FOR INCREASING THE COPPER TO SUPERCONDUCTOR RATIO IN A SUPERCONDUCTOR WIRE

(75) Inventors: William G. Marancik, Ebony, VA (US); Seung Hong, New Providence, NJ (US)

(73) Assignee: Oxford Superconducting Technology, Carteret, NJ (US)

( * ) Notice: Subject to any disclaimer, the term of this patent is extended or adjusted under 35 U.S.C. 154(b) by 88 days.

(21) Appl. No.: 10/690,850

(22) Filed: Oct. 22, 2003

(65) Prior Publication Data

US 2004/0209779 A1 Oct. 21, 2004

Related U.S. Application Data

(60) Provisional application No. 60/423,200, filed on Nov. 1, 2002.

(51) Int. Cl.[7] ............................ C22F 1/16; H01L 39/24; C25D 5/50; C25D 7/00
(52) U.S. Cl. .............................. 148/98; 148/96; 29/599; 205/51; 205/228
(58) Field of Search ................................. 505/434, 472; 29/599; 148/96, 98; 205/51, 149, 228, 291

(56) References Cited

U.S. PATENT DOCUMENTS

| 3,829,963 A | | 8/1974 | McDougall et al. |
| 3,838,503 A | | 10/1974 | Suenaga et al. |
| 3,954,572 A | * | 5/1976 | Ziegler et al. ................. 205/51 |
| 4,148,129 A | | 4/1979 | Young |
| 4,224,735 A | | 9/1980 | Young et al. |
| 4,341,572 A | * | 7/1982 | Tachikawa et al. ........... 148/98 |
| 4,377,905 A | | 3/1983 | Agatsuma et al. |
| 4,435,228 A | * | 3/1984 | Tachikawa et al. ........... 148/98 |
| 4,564,564 A | | 1/1986 | Schuller et al. |
| 4,939,308 A | | 7/1990 | Maxfield et al. |
| 5,132,278 A | | 7/1992 | Stevens et al. |
| 5,189,386 A | | 2/1993 | Tada et al. |
| 5,244,875 A | | 9/1993 | Hauser et al. |
| 5,470,820 A | | 11/1995 | Hauser et al. |
| 6,199,266 B1 | | 3/2001 | Meserve |
| 6,372,054 B1 | * | 4/2002 | Kikuchi et al. ................ 148/98 |

* cited by examiner

Primary Examiner—Mark Kopec
(74) Attorney, Agent, or Firm—Klauber & Jackson

(57) ABSTRACT

A method for producing a superconductor having a high copper to superconductor composition (Cu/SC) ratio by cross-sectional area. An assembly is prepared formed of one or more fine filaments of a superconductor composition or of a precursor component for a superconductor alloy composition, which filaments are embedded in a copper-based matrix. The assembly is electroplated with copper to increase the Cu/filament ratio in the resulting product, and thereby increase the said Cu/SC ratio to improve the stability of the final superconductor.

13 Claims, No Drawings

METHOD FOR INCREASING THE COPPER TO SUPERCONDUCTOR RATIO IN A SUPERCONDUCTOR WIRE

RELATED APPLICATION

This application claims priority from U.S. Provisional Patent Application 60/423,200, filed Nov. 1, 2002.

BACKGROUND OF THE INVENTION

Superconductor wire is commonly formed of one or more fine filaments of superconductor composition (e.g. NbTi or $Nb_3Sn$) which are embedded in a copper or copper-based matrix. A typical processing sequence for producing a NbTi multifilament conductor using a hex stack, starts with a can of copper which is fabricated by back extruding a copper pipe 12 inches in diameter and 36 inches long. A cone is fixed to one end and the interior of the can is filled with hexagonal rods. The rods are a composite with a round core of NbTi and a jacket of copper. The rods are assembled into the can in a hexagonal array to completely fill the interior with a minimum void volume. The spaces between the ID of the can and the hex stack, which are too small to accommodate a full hex, are filled with partial hexes of copper cut to fit the spaces.

A lid is pressed onto the can and the can is evacuated and welded by an electron beam welder. The assembly is then extruded from the 12 inch diameter to about 3 inches. The rod thus formed is over 40 ft long and is then drawn in steps of about 20% area reduction to final size. At various places during the drawing process, the rod/wire is heat treated to cause precipitation, which increases the current density of the final wire.

The NbTi hex composite rods are themselves fabricated by extrusion. Typically, an eight-inch billet of NbTi is inserted into a copper can that is sealed as above and extruded. The resultant rod is drawn and hexed at the desired size without any intermediate heat treatment.

An example of a typical process for the manufacture of a multifilamentary $Nb_3Sn$ conductor, begins with the drilling of a plurality of holes in a Cu/Sn bronze billet for the insertion of Nb rods. This billet is then extruded to a rod, which is then drawn down to a fine wire. In some cases it is desirable that even more filaments be produced; this can be done by cutting the rod into a large number of equal lengths at some intermediate size, inserting these into an extrusion can, extruding this assembly and drawing the result to fine wire. The extrusion can in this case is either copper with a Nb or Ta barrier to prevent Sn diffusion, or bronze. The rod may be drawn through a hex-shaped die prior to cutting; if the rod is thus hexed, the lengths pack together in the extrusion can with less wasted space. In some cases it is desirable that there be provided a quantity of pure copper of good electrical conductivity. This may be done by lining a copper extrusion can with a layer of metal such as Ta or Nb which (in the case of $Nb_3Sn$) is impermeable to tin, during high temperature heat-treatment, so that the tin does not diffuse into the copper and lower its conductivity; tantalum is the metal most commonly used. See, e.g., U.S. Pat. No. 3,996,661.

The copper to superconductor ratio of a superconductor wire (expressed as the ratio of area of copper to area of superconductor "Cu/SC" in a cross-section of the wire) is an important parameter related to stability. A quantity of a good electrical conductor in close proximity to the superconductive material is useful as an alternate current path or shunt in situations where it is likely that some fraction of the superconductive filaments will return to the normally-conducting state, which can happen, for example, in a rapidly-varying magnetic field. If in the initial phase of manufacture of the wire all of the required copper is included in the original billet, the cost of the process is very high. In addition, the processing becomes far more difficult if not impossible. To produce a superconductor with a large amount of copper is difficult because of the possibility of center burst. Center burst is the occurrence of broken filaments in the center of the composite. Center burst occurs during wire drawing if the ratio of soft matrix (copper) to hard filaments (e.g. NbTi) is too high. By maintaining this ratio low, i.e., by using a low amount of copper during the initial fabrication steps, one can avoid this problem. The alternative is to add additional copper at the final stages of fabrication. Various means have been devised to clad this additional copper in the final manufacturing step. These include:

a) Soldering the low copper to superconductor ratio wire into a copper channel. For example, a superconductor wire (core wire) with a ratio of 1:1 copper to superconductor can be converted to an 8:1 ratio by soldering the core wire into a copper channel.

b) Hot cladding on a cladding line.

c) Cladding on a tube mill.

d) Cabling copper wire around a core wire of superconductor.

There are disadvantages to all of the above processes. Soldering precludes further processing due to the weak bonding and because of the low melting point of the solder. Further hot processing cannot be done such as FORMVAR insulating. (FORMVAR® is a registered trademark of Chisso Corporation for modified resins, used here for insulating films.) The solder would melt causing considerable problems. Hot cladding subjects the superconductor to very high temperatures in order to create a copper to copper bond. This bond is not always of the quality required and the high temperature may reduce the current density of the conductor. Cladding on a tube mill does not form a metallic bond between the copper tube clad over the superconductor core. Even with extensive redrawing, a true metallic bond is not formed and thus redrawing can subject the core to various problems such as center burst. Cabling usually requires soldering with the limitations noted above, as well as damage to the core wire if the cable is subjected to any reduction or shaping operations.

SUMMARY OF THE INVENTION

The present invention overcomes all of the problems indicated above. The present invention uses electroplating to increase the copper to superconductor ratio in the superconductor wire. In electroplating, the deposited copper is metallically bonded to the core wire. This deposit is similar to or even indistinguishable (where the matrix embedding the filament is copper) from the core and the composite wire can be further worked (e.g., cold worked) to produce various final shapes. The electroplated wire can also be hot processed for insulating with FORMVAR.

In general a copper to superconductor ("Cu/SC") or copper to filament (Cu/filament) ratio range (by cross-sectional area) of from about 0.5 to about 3 is useful for the unmodified wire processed by the invention, the preferable ratio depending in part upon whether the unmodified starting wire is a single core wire or a multifilament wire. A preferred Cu/SC (or Cu/filament) range for the unmodified NbTi wire is from about 0.5 to 1.5. By "unmodified wire" is meant the wire which has already been manufactured from a starting billet and worked by extrusion, drawing etc.; but prior to its ratio of copper to superconductor or filament being increased by the present invention. The 0.5 to 1.0 portion of the ratio range principally applies to a single core wire (e.g., a single NbTi core). In the instance of an unmodified multifilament wire it is difficult to go below 1.0 because of the copper between the filaments. The final copper to superconductor ratio yielded by the invention can be almost any desired value, with a typical final Cu/SC range being from about 2:1 to about 5:1, i.e., a ratio of from about 2.0 to 5.0. The upper limit will depend on whether alternate means of increasing the ratio becomes more economical and also if post processing such as FORMVAR insulation is to be applied. A soldered conductor cannot be Formvar coated because of the heat it is subjected to during coating, which would melt the solder.

In a typical procedure an unmodified NbTi superconductor wire is manufactured with a low copper to superconductor ratio, e.g., 1:1 or less. A spool of this unmodified NbTi wire is set up as the input wire to a reel to reel wire plating line and passed through first a cleaning/etching section and then through multiple passes of the copper deposition section. In this section, the wire acting as a cathode is subjected to a plating potential and a predetermined thickness of copper is deposited. The wire then passes through a cleaning section, and is dried and re-spooled. The anode material used is a high purity copper to insure a high conductivity copper deposit. A number of conventional electrolyte solutions can be used for the copper plating bath including a copper sulfate electrolyte, a copper cyanide electrolyte, and a copper fluoroborate electrolyte. Typically plating current densities of 300 to 500 amp/ft$^2$ and even as high as 2800 amp/ft$^2$ can be used under appropriate operating conditions. See Janssen, "High Speed Copper Deposition" and Safranek "High Speed Electroplating" *Plating and Surface Finishing*, April 1982, pages 48–53. Also see "Electroplating Wire and Strip Using High Current Densities—Possibilities and Limitations", Peter Kutzschbach, Wolfgang Rempt, Klaus-Dieter Baum, Heinz Liebscher, *Wire* 45 (1995) 6 page 336. The plating devices and methods used in the present invention are per se conventional. Reference may be had in such connection to *Electroplating Engineering Handbook*, A. Kenneth Graham, 3$^{rd}$ Ed, 1971 e.g. at page 239.

Depending on what further processing is to be done the electroplated wire may be annealed, cold drawn into various shapes or sizes, hot processed, insulated etc. as any monolithic wire.

The final superconductor wire resulting from the process of the invention is one wherein the superconductor filaments comprise NbTi or Nb$_3$Sn. In the instance of NbTi the initial assembly may use commercially available NbTi rods. Hence the electroplating step is conducted without subjecting the assembly to a prior heating step to effect diffusion and form the NbTi.

In the instance of the filaments ultimately comprising Nb$_3$Sn the filaments in the assembly processed by the invention are initially Nb which is a precursor constituent for the superconductor filaments. The Sn will be subsequently heat diffused into the Nb from the copper based matrix, which in this case is a bronze including Sn. Such matrix in this case is surrounded with a diffusion barrier, e.g. of Ta or Nb. However the heat treatment to form the filaments into superconductor Nb$_3$Sn is only carried out subsequent to the electroplating, e.g. after the product resulting from the invention is formed into a coil for use with a magnet. The diffusion barrier here prevents Sn from the matrix diffusing into the electroplated copper. Thus in neither the instance where the embedded filaments are superconductor NbTi, and in the instance where the filaments are Nb which is a precursor to the Nb$_3$Sn later to be formed, a heating stop for diffusion of an alloying element is not used upon the assembly prior to the electroplating step.

DESCRIPTION OF PREFERRED EMBODIMENT

The process of the present invention is illustrated by the following Examples.

EXAMPLE 1

A multifilament NbTi input wire used as the unmodified wire is a superconductor with a copper to superconductor (i.e., NbTi) cross-sectional area ratio (Cu/SC) of 1:1. The wire passes through a high speed plating system with a copper sulfate—sulfuric acid plating bath where it is electroplated with copper to produce a final conductor with a copper to superconductor area ratio of 3.5:1. The wire diameter entering the system is 0.032" diameter and 8 mils (16 mils total build) of copper are deposited on the wire to produce a final diameter of 48 mils. The wire entering the electroplating bath thus had a Cu/SC area ratio of 1:1 and exited the plating system at 3.5:1. In a further plating operation an unmodified 0.037 diameter 1:1 Cu/SC ratio wire is plated with 0.004 inches of copper resulting in a final conductor with a Cu/SC ratio of 2:1. Most any ratio of conductor can be fabricated by selecting the initial wire diameter, initial copper to superconductor ratio, and the amount of copper plated.

EXAMPLE 2

In a further plating operation an input unmodified multifilament NbTi 0.035 inch wire with a 1:1 Cu/SC ratio is built up to 0.050 inches after plating with the bath of Example 1 to give a 3:1 Cu/SC ratio. 2000 ft of wire are immersed in the bath at a given time at 300 amps/ft$^2$ processing, and at a line feed rate of 62 ft/min. Doubling the amps/ft$^2$ current density or the length of wire immersed in the bath will enable doubling of the line speed. The power consumed to produce 1-Km of plated wire in this Example is 56.7 KW-hours.

EXAMPLE 3

Utilizing a bath electrolyte as in the prior Example, and again starting with a 0.035 inch wire and building up to 0.050" after plating to give a 3:1 Cu/SC (as above), and with 1000 ft of wire immersed in the bath at 500 amps/ft$^2$, a line feed rate of 52 ft/min is used. The power consumed will be the same, dependent only on the quantity of copper plated.

The versatility of the foregoing process allows the stocking of a single wire configuration. When required this wire can be quickly converted to the desired copper to superconductor ratio. In the past, such conversion to a specific ratio would take many months, but by using the electroplating process of the invention, turn around time can be shortened to weeks. Manufacture of small quantities of specific wire was not in the past practical because of the cost; however, electroplating can economically produce even small quantities of wire form stocked precursor wire economically. A single wire can also be made with a continuously changing superconductor ratio by programming the plating line speed or plating current. This can further reduce the cost of high intensity magnet manufacture.

While the present invention has been described in terms of specific embodiments thereof, it will be understood in view of the present disclosure, that numerous variations upon the invention are now enabled to those skilled in the art, which variations yet reside within the scope of the present teaching. Accordingly, the invention is to be broadly construed, and limited only by the scope and spirit of the present disclosure and claims.

What is claimed is:

1. A method for producing a superconductor having a high copper to superconductor composition (Cu/SC) ratio by cross-sectional area, comprising in sequence the steps of:

(a) preparing by a sequence of operations which include one or more drawing steps, an assembly formed of one or more fine filaments of a NbTi superconductor composition or of Nb as a precursor component for a $Nb_3Sn$ superconductor alloy composition, which filaments are embedded in a copper-based matrix; and (b) without subjecting said assembly to a prior heating step to diffuse an alloying element into said filaments, electroplating the assembly from step (a) with copper to increase the Cu/filament ratio by cross-sectional area in the resulting product, and thereby increase the said Cu/SC ratio to improve the stability of the final superconductor; and (c) subsequent to step (b) heat diffusing said alloying element into said filaments in the instance where said filaments comprise $Nb_3Sn$ said superconductor precursor and said matrix includes Sn as said alloying element for said $Nb_3Sn$ superconductor composition, said heat diffusing being conducted while preventing diffusion of said Sn alloying element into the said electroplated copper by means of a diffusion barrier layer, and wherein when said diffusion to form $Nb_3Sn$ is carried out said electroplated assembly is in the form of a magnet.

2. The method of claim 1, wherein the superconductor comprises NbTi.

3. The method of claim 1, wherein the Cu/filament ratio by area in the product of step (a) is from about 0.5 to 3 and wherein the Cu/SC ratio in the final product resulting from said method is from about 2.0 to 5.0.

4. The method of claim 3, wherein said Cu/filament cross-sectional area ratio in the product of step (a) is from about 0.5 to 1.5.

5. The method of claim 4, wherein said one more filaments comprise Nb which in step (c) is reacted with Sn contained in said matrix to form $Nb_3Sn$.

6. The method of claim 4, wherein the superconductor or precursor component in step (a) is a single core wire and the said Cu/filament cross-sectional area ratio in the product of step (a) is from about 0.5 to 1.0.

7. The method of claim 6, wherein said core wire is NbTi.

8. The method of claim 4, wherein the superconductor or precursor component in step (a) is a multifilament wire wherein the Cu/filament cross-sectional area ratio is at least 1.0.

9. The method of claim 8, wherein said multifilaments comprise said NbTi superconductor composition.

10. The method of claim 8, wherein said filaments comprise Nb which in step (c) is reacted with Sn contained in said matrix to form $Nb_3Sn$.

11. The method of claim 1, wherein the current density used in step (b) for electroplating is at least 300 amp/$ft^2$.

12. The method of claim 1, wherein the product of step (b) is subjected to further processing.

13. The method of claim 1, wherein the product of step (b) is subjected to a metal working step prior to step (c).

* * * * *